United States Patent
Kasama et al.

(10) Patent No.: US 10,453,723 B2
(45) Date of Patent: Oct. 22, 2019

(54) GAS PURGE FILTER

(71) Applicant: MIRAIAL Co., Ltd, Tokyo (JP)

(72) Inventors: Nobuyuki Kasama, Tokyo (JP); Tsuyoshi Nagashima, Tokyo (JP)

(73) Assignee: Miraial Co., Ltd., Tokyo (JP)

( * ) Notice: Subject to any disclaimer, the term of this patent is extended or adjusted under 35 U.S.C. 154(b) by 248 days.

(21) Appl. No.: 15/523,852

(22) PCT Filed: Oct. 28, 2015

(86) PCT No.: PCT/JP2015/080349
§ 371 (c)(1),
(2) Date: May 2, 2017

(87) PCT Pub. No.: WO2016/076111
PCT Pub. Date: May 19, 2016

(65) Prior Publication Data
US 2018/0308733 A1     Oct. 25, 2018

(30) Foreign Application Priority Data
Nov. 12, 2014 (JP) .................... 2014-229874

(51) Int. Cl.
| | |
|---|---|
| *H01L 21/673* | (2006.01) |
| *B01D 46/00* | (2006.01) |
| *B01D 46/10* | (2006.01) |
| *F16K 15/02* | (2006.01) |
| *B01D 46/42* | (2006.01) |
| *B01D 46/52* | (2006.01) |

(52) U.S. Cl.
CPC .... *H01L 21/67393* (2013.01); *B01D 46/0005* (2013.01); *B01D 46/10* (2013.01); *B01D 46/4272* (2013.01); *B01D 46/526* (2013.01); *F16K 15/026* (2013.01); *F16K 15/028* (2013.01); *B01D 2279/35* (2013.01); *B01D 2279/45* (2013.01)

(58) Field of Classification Search
CPC ............ H01L 21/67393; F16K 15/026; F16K 15/028; B01D 46/0005; B01D 2279/35; B01D 46/10; B01D 46/4272
See application file for complete search history.

(56) References Cited

U.S. PATENT DOCUMENTS

| | | |
|---|---|---|
| 7,455,180 B2 | 11/2008 | Sumi et al. |
| 8,727,125 B2 | 5/2014 | Tieben et al. |
| | (Continued) | |

FOREIGN PATENT DOCUMENTS

| | | |
|---|---|---|
| JP | H07-040774 Y2 | 9/1995 |
| JP | H08-203993 A | 8/1996 |
| | (Continued) | |

*Primary Examiner* — Robert Clemente
(74) *Attorney, Agent, or Firm* — Muncy, Geissler, Olds & Lowe, P.C.

(57) ABSTRACT

Disclosed is a gas purge filter used in a housing container provided with a container main body and a lid body. The gas purge filter has a filter housing having a ventilation space where gas outside the housing container and gas of a housing space can be ventilated, and a pad formed outside the housing space of the filter housing to cover an outer peripheral face of a nozzle portion that forms a part of the ventilation space. The pad is formed of an elastic body.

4 Claims, 9 Drawing Sheets

(56) References Cited

U.S. PATENT DOCUMENTS

2005/0077204 A1* 4/2005 Sumi .................... F16K 15/026
206/710
2008/0121560 A1 5/2008 Tieben et al.

FOREIGN PATENT DOCUMENTS

| | | | |
|---|---|---|---|
| JP | 2007-533166 | A | 11/2007 |
| JP | 4201583 | B2 | 12/2008 |
| JP | 4204302 | B2 | 1/2009 |
| JP | 2012-164948 | A | 8/2012 |
| JP | 5213440 | B2 | 6/2013 |
| JP | 5241607 | B2 | 7/2013 |
| JP | 2014-036185 | A | 2/2014 |
| WO | WO 2012/108418 | A1 | 8/2012 |

* cited by examiner

GAS PURGE FILTER

TECHNICAL FIELD

The present invention relates to a gas purge filter provided in a housing container used to house, store, convey, or deliver a substrate formed of a semiconductor wafer or the like.

BACKGROUND ART

A housing container provided with a container main body and a lid body to house substrates formed of semiconductor wafers and convey them for use in a factory process is known in the art.

The container main body has a container main body opening portion in one end portion and a tubular wall portion formed in the other closed end portion. The lid body can be removably attached to the container main body opening portion and close the container main body opening portion. By closing the container main body with the lid body, a housing space for housing substrates and the like is formed inside the housing container. The housing space is surrounded by wall portions of the container main body and an inner surface of the lid body and can house a plurality of substrates.

A front retainer is provided in a part of the lid body facing the housing space when the container main body opening portion is closed. The front retainer can support edge portions of a plurality of substrates when the container main body opening portion is closed by the lid body. In addition, a back side substrate support portion is provided in the wall portion paired with the front retainer. The back side substrate support portion can support edge portions of a plurality of substrates. The back side substrate support portion supports a plurality of substrates in cooperation with the front retainer while the container main body opening portion is closed by the lid body. As a result, a plurality of substrates are held while the neighboring substrates are arranged side by side separated at a predetermined interval (refer to Patent Documents 1 and 2).

In addition, a filter is provided in the container main body. A check valve is provided inside the filter as necessary. A gas purge operation is performed from the outside of the housing container to the housing space through the filter using an inert gas such as nitrogen or a dry air (hereinafter, referred to as a "purge gas") with moisture being evaporated (1% or lower). The check valve prevents leakage of the gas charged in the housing space during the gas purge operation (refer to Patent Documents 3 and 4).

The filter is installed in a through-hole (access opening) provided in the container main body to install the filter. In this case, in order to seal the container main body and the filter, a filter housing (grommet) is formed of an elastic material in some cases (Patent Document 5). In addition, in order to perform the gas purge operation, it is necessary to allow a purge port of the gas purge device and the filter to abut each other. Even in this case, since the filter housing is formed of an elastic material, the filter housing in a part where the purge port abuts is elastically deformed to allow the leading edge of the purge port and the filter to abut each other when the purge port is pressed by the filter. As a result, it is possible to effectively perform the gas purge operation for the housing space of the housing container using the purge gas.

Patent Document 1: Japanese Patent No. 4204302
Patent Document 2: Japanese Patent No. 4201583
Patent Document 3: Japanese Patent No. 5241607
Patent Document 4: Japanese Unexamined Patent Application, Publication No. 2007-533166
Patent Document 5: Japanese Patent No. 5213440

DISCLOSURE OF THE INVENTION

Problems to be Solved by the Invention

By using an elastic material as a material of the filter housing as described above, it is possible to easily seal the housing container and the filter, secure adhesion between the filter and the purge port, and perform effective gas purge operations. However, a ventilation space where the purge gas of the filter housing passes is also formed of an elastic material, and the purge gas flows into the housing space while it comes into contact with the elastic material. The elastic material has a high moisture/water absorption rate and also discharges a large amount of outgas.

In recent years, there has been a demand for the refinement of a semiconductor process and the improvement of a production yield of semiconductor chips. For this purpose, it is also required that a housing container that houses the semiconductor wafers effectively reduces outgas such as an organic gas or a chlorine gas generated from a material of the housing container or the humidity inside the container.

For this reason, a gas purge operation using a purge gas is performed. However, since the purge gas passes through a ventilation space of the filter housing molded with an elastic material, moisture contained in the elastic material or an outgas hazardous to the semiconductor wafers is mixed in the purge gas. This makes it unpreferably difficult to maintain an internal environment in the housing container in a clean condition and reduces a production yield of semiconductor chips.

This problem may be addressed if the filter housing is formed of resin having a low amount of outgas and a low moisture/water absorption rate. However, in this case, elasticity is degraded, so that adhesion with the purge port is degraded. Unpreferably, particles or undesirable gas or moisture may intrude into the inside of the housing container from the gap between the purge port and the filter. In addition, due to degradation of adhesion between the filter housing and the purge port, the purge gas may leak from the tip end portion of the purge port, so that efficiency of the gas purge operation may be unpreferably degraded. Therefore, it is difficult to address the aforementioned problems of the background art at the same time.

The present invention provides a gas purge filter capable of effectively substituting the gas inside the housing space of the housing container with the purge gas and maintaining cleanness inside the housing container.

Means for Solving the Problems

According to the present invention, a gas purge filter is provided in a housing container internally provided with a housing space formed by a container main body having a container main body opening portion in one end portion and a lid body that can be removably attached to the container main body opening portion and can close the container main body opening portion, the gas purge filter being installed in an access opening that can allow an external space of the housing container formed in at least one of the container main body or the lid body and the housing space to communicate with each other, the gas purge filter comprising: a filter housing having a ventilation space where gas outside the housing container and gas of the housing space can be ventilated; and a pad formed outside the housing space of the filter housing to cover an outer peripheral face of a nozzle portion that forms a part of the ventilation space, wherein the filter housing is formed of thermoplastic resin, and the pad is formed of an elastic body.

Preferably, the gas purge filter further comprises: a gas purge filter leading-end portion having a nozzle tip end portion formed in a tip end portion of the nozzle portion in the housing-space outward direction; and a pad outer-leading-end portion formed in a leading end portion of the pad in the housing-space outward direction, wherein, when a purge port of the gas purge device for purging an internal gas of the housing container abuts the gas purge filter leading-end portion to perform a gas purge operation, the nozzle tip end portion is placed in the same position as that of the pad outer-leading-end portion abutting the gas purge filter leading-end portion or protrudes in the housing-space outward direction.

Preferably, before the purge port abuts the gas purge filter leading-end portion, the pad outer-leading-end portion is placed in the same position as that of the nozzle tip end portion or protrudes in the housing-space outward direction.

Preferably, before the purge port abuts the gas purge filter leading-end portion, the nozzle tip end portion protrudes in the housing-space outward direction from the position of the pad outer-leading-end portion.

Preferably, an inner diameter of the pad outer-leading-end portion in a single body state of the pad is smaller than an outer diameter of the nozzle tip end portion.

Preferably, a check valve mechanism for restricting a flow direction of the gas in a certain direction is provided in the ventilation space of the filter housing.

Effects of the Invention

According to the present invention, it is possible to effectively substitute gas inside the housing space of the housing container and provide a gas purge filter capable of maintaining internal cleanness of the housing container. For this reason, it is possible to increase an exposure rate of the semiconductor wafer to an inert gas or dry air. Therefore, it is possible to improve a production yield of the semiconductor chips manufactured from the semiconductor wafer. Furthermore, since the gas can be effectively substituted with the purge gas within a short time, it is possible to shorten process time and reduce costs.

PREFERRED MODE FOR CARRYING OUT THE INVENTION

First Embodiment

Figure 1:
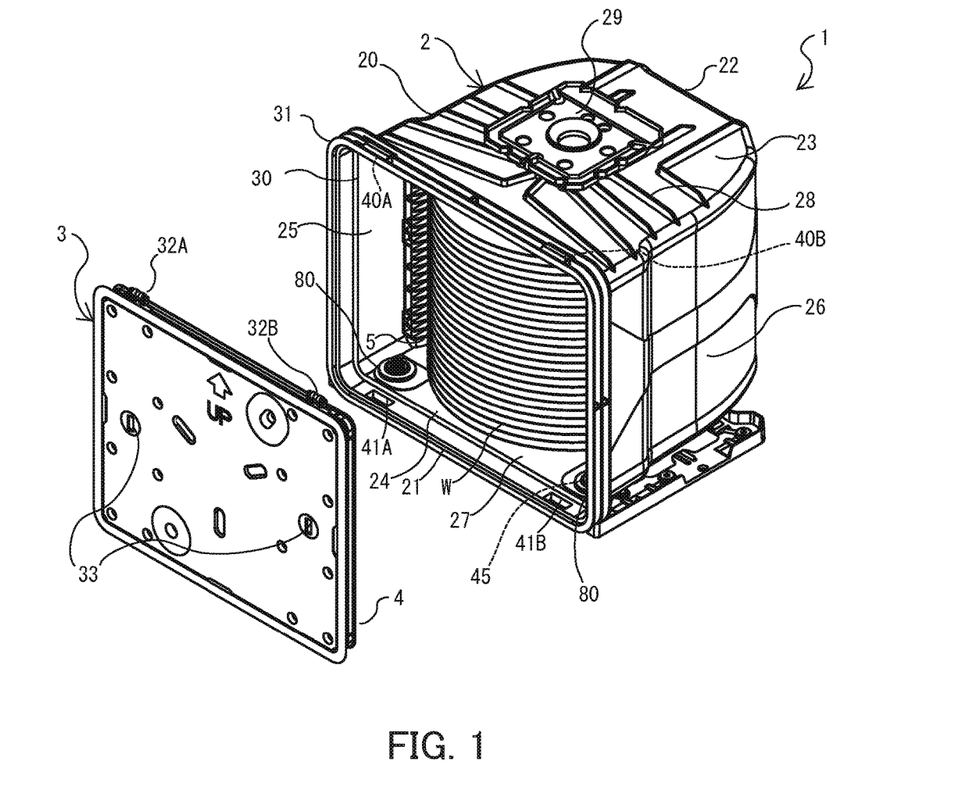
FIG. 1 is an exploded perspective view illustrating a state in which a gas purge filter 80 according to a first embodiment of the present invention is installed in a housing container 1 to house substrates W.
Figure 3A:
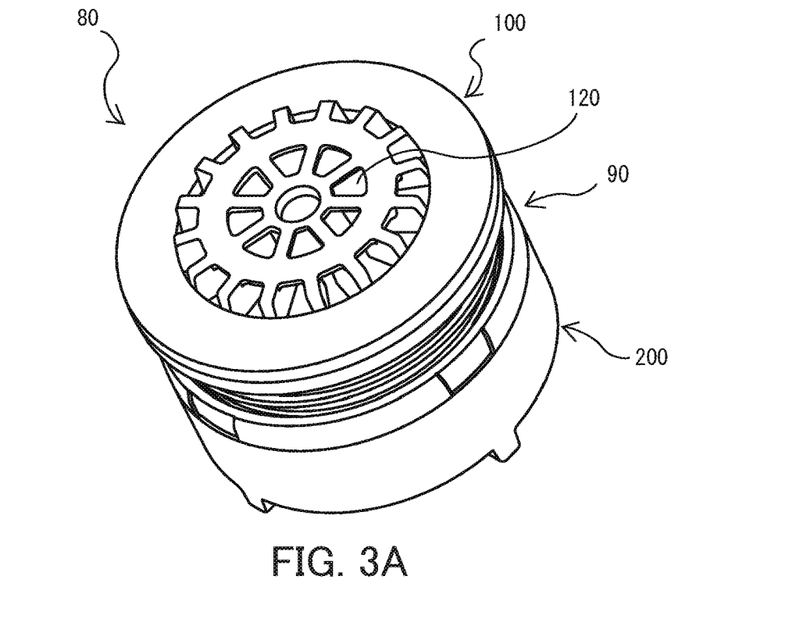
FIG. 3A is an upper perspective view illustrating the gas purge filter 80 according to the first embodiment of the present invention.
Figure 3B:
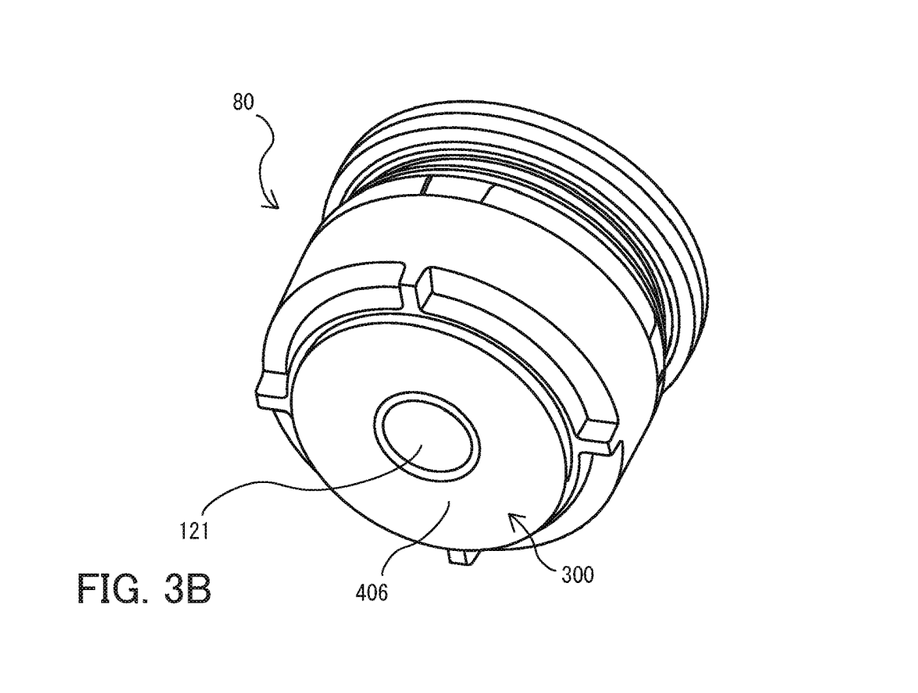
FIG. 3B is a lower perspective view illustrating the gas purge filter 80 according to the first embodiment of the present invention.
Figure 4:
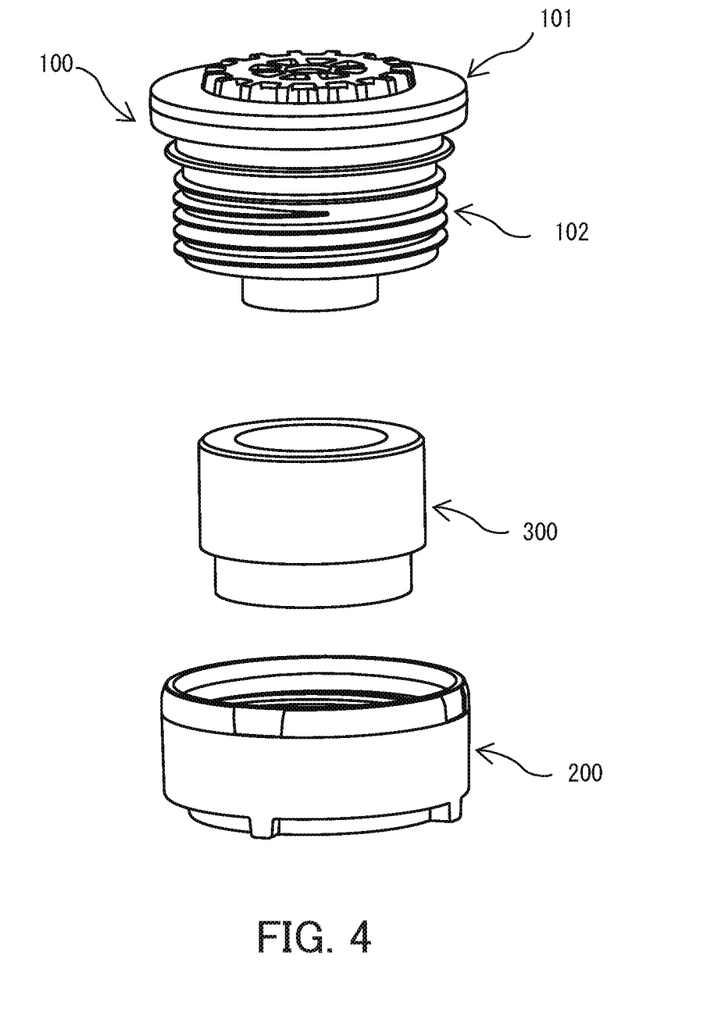
FIG. 4 is an exploded perspective view illustrating the gas purge filter 80 according to the first embodiment of the present invention.
Figure 5:
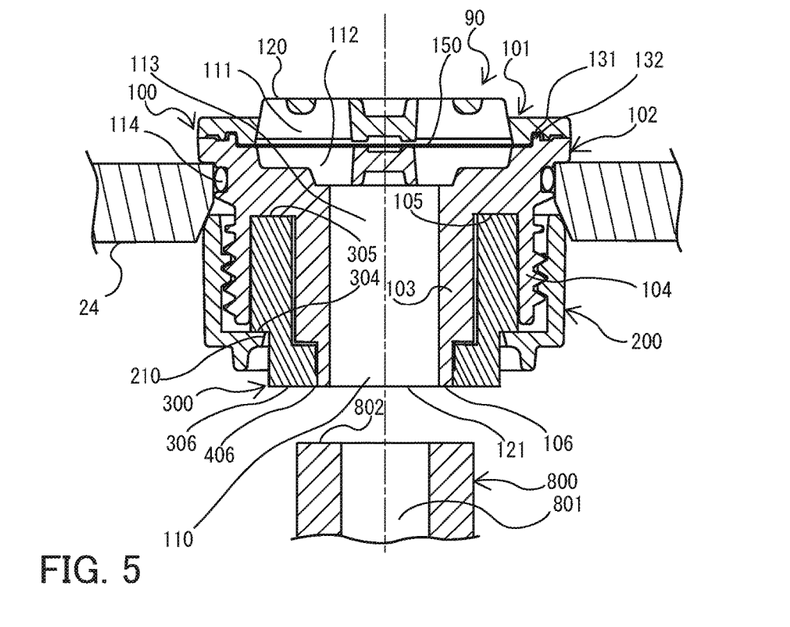
FIG. 5 is a cross-sectional view illustrating a part for installing the gas purge filter 80 according to the first embodiment of the present invention in the housing container 1.
Figure 6:
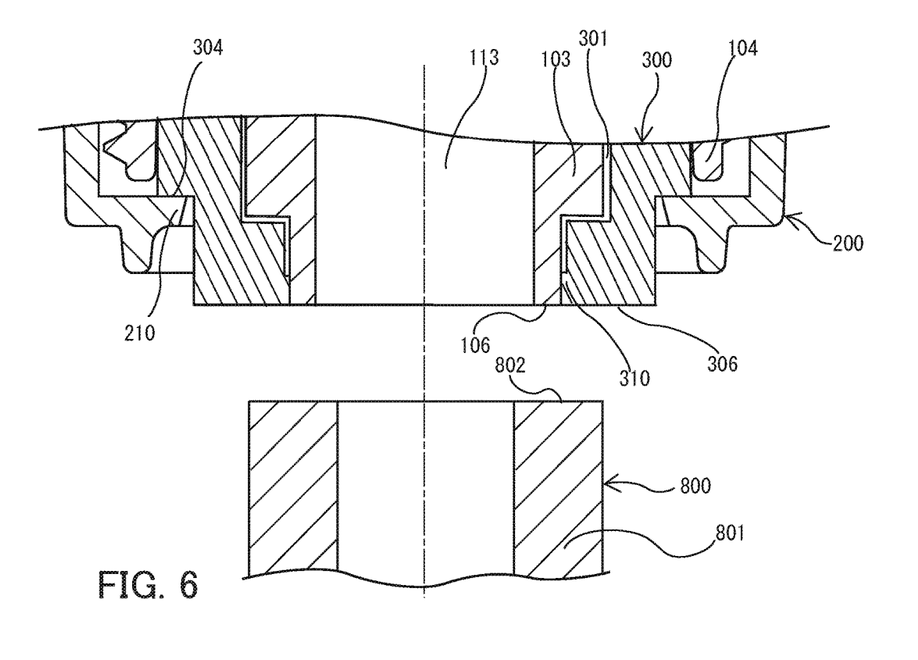
FIG. 6 is an enlarged cross-sectional view illustrating the vicinity of the gas purge filter leading-end portion 406 of FIG. 5.

A gas purge filter 80 according to a first embodiment of the present invention will now be described with reference to the accompanying drawings. FIG. 1 is an exploded perspective view illustrating a state in which the gas purge filter 80 according to the first embodiment of the present invention is installed in a housing container 1 housing a substrate W. FIG. is a lower perspective view illustrating a state in which the gas purge filter 80 according to the first embodiment of the present invention is installed in the housing container 1. FIG. 3A is an upper perspective view illustrating the gas purge filter 80 according to the first embodiment of the present invention. FIG. 3B is a lower perspective view illustrating the gas purge filter 80 according to the first embodiment of the present invention. FIG. 4 is an exploded perspective view illustrating the gas purge filter 80 according to the first embodiment of the present invention. FIG. 5 is a cross-sectional view illustrating a part for installing the gas purge filter 80 according to the first embodiment of the present invention in the housing container 1. FIG. 6 is an enlarged cross-sectional view illustrating the vicinity of the gas purge filter leading-end portion 406 of FIG. 5.

Herein, for convenient description purposes, a direction from a container main body 2 to a lid body 3 described below (in FIG. 1, from the upper right side to the lower left side) will be referred to as a "front" direction, and a direction opposite thereto will be referred to as a "rear" direction. In addition, the front and rear directions will be collectively referred to as a "front-rear" direction. Furthermore, a direction from a lower wall 24 to an upper wall 23 described below will be referred to as an "upper" direction (in FIG. 1, the upward direction), and a direction opposite thereto will be referred to as a "lower" direction. In addition, the upper and lower directions will be collectively referred to as a "vertical" direction. Moreover, a direction from a second side wall 26 to a first side wall 25 described below (in FIG. 1, a direction from the lower right side to the upper left side) will be referred to as a "left" direction, and a direction opposite thereto will be referred to as a "right" direction. In addition, the left and right directions will be collectively referred to as a "left-right" direction.

A substrate W (refer to FIG. 1) housed in the housing container 1 is a disk-like silicon wafer, a glass wafer, a sapphire wafer, or the like, and is a thin member employed in industries. The substrate W according to the present embodiment is a silicon wafer having a diameter of 300 to 450 mm.

As illustrated in FIG. 1, the housing container 1 houses the substrate W formed from a silicon wafer as described above and is used as an in-process container conveyed in a factory process or a shipping vessel for delivering a substrate on a land transportation means, an airplane transportation means, or a marine transportation means. The housing container 1 includes a container main body 2, a lid body 3, a substrate support plate-like portion 5 as a side substrate support portion, a back side substrate support portion (not illustrated), and a front retainer (not illustrated) as a lid body side substrate support portion.

The container main body 2 has a tubular wall portion 20 having one end portion provided with a container main body opening portion 21 and the other closed end portion. A housing space 27 is formed in the container main body 2. The housing space 27 is surrounded by the wall portion 20. A substrate support plate-like portion 5 is disposed in a part of the wall portion 20 that forms the housing space 27. As illustrated in FIG. 1, a plurality of substrates W can be housed in the housing space 27.

The substrate support plate-like portions 5 are provided in the wall portions 20 in pairs inside the housing space 27. The substrate support plate-like portions 5 abut on edge portions of a plurality of substrates W while the container main body opening portion 21 is not closed by the lid body 3. As a result, the substrate support plate-like portions 5 can support edge portions of a plurality of substrates W while neighboring substrates W are arranged side by side separated at a predetermined interval. A back side substrate support portion (not illustrated) is provided on a back side of the substrate support plate-like portion 5.

The back side substrate support portion (not illustrated) is provided in the wall portion 20 paired with the front retainer (not illustrated) inside the housing space 27. The back side substrate support portions (not illustrated) abut the edge portions of a plurality of substrates W while the container main body opening portion 21 is closed by the lid body 3. As a result, the back side substrate support portion can support rear sides of the edge portions of a plurality of substrates W.

The lid body 3 can be removably attached to an opening peripheral portion 31 forming the container main body opening portion 21 (FIG. 1, etc.) and close the container main body opening portion 21. A front retainer (not illustrated) is provided in a part of the lid body 3 facing the housing space 27 while the container main body opening portion 21 is closed by the lid body 3. The front retainer (not illustrated) is arranged inside the housing space 27 paired with the back side substrate support portion (not illustrated).

The front retainer (not illustrated) abuts the edge portions of a plurality of substrates W to support front parts of the edge portions of the substrates W while the container main body opening portion 21 is closed by the lid body 3. The front retainer (not illustrated) supports a plurality of substrates W in cooperation with the back side substrate support portion (not illustrated) while the container main body opening portion 21 is closed by the lid body 3. As a result, a plurality of substrates W are held while the neighboring substrates W are arranged side by side separated by a predetermined interval.

The housing container 1 is formed of resin such as a plastic material. Unless specified otherwise, such a resin material may include, for example, a thermoplastic resin such as polycarbonate, cycloolefin polymer, polyetherimide, polyether ketone, poly butyl terephthalate, polyetheretherketone, and a liquid crystal polymer, an alloy thereof, and the like. A conductive material such as carbon fiber, carbon powder, carbon nanotubes, and conductive polymer is optionally added to the resin of such a molding material. In addition, in order to improve rigidity, glass fiber or carbon fiber may also be added.

Each part will now be described in details. As illustrated in FIG. 1, the wall portion 20 of the container main body 2 includes a back wall 22, an upper wall 23, a lower wall 24, a first side wall 25, and a second side wall 26. The back wall 22, the upper wall 23, the lower wall 24, the first side wall 25, and the second side wall 26 are formed of the aforementioned materials and are integrally molded.

The first side wall 25 faces the second side wall 26, and the upper wall 23 faces the lower wall 24. A rear end of the upper wall 23, a rear end of the lower wall 24, a rear end of the first side wall 25, and a rear end of the second side wall 26 are all connected to the back wall 22. A front end of the upper wall 23, a front end of the lower wall 24, a front end of the first side wall 25, and a front end of the second side wall 26 are positioned to be opposite to the back wall 22 to form an opening peripheral portion 31 that forms the container main body opening portion 21 having a substantially rectangular shape.

The opening peripheral portion 31 is provided at one end portion of the container main body 2, and the back wall 22 is located at the other end portion of the container main body 2. The profile of the container main body 2 formed by the outer faces of the wall portion 20 has a box shape. Inner faces of the wall portion 20, that is, an inner face of the back wall 22, an inner face of the upper wall 23, an inner face of the lower wall 24, an inner face of the first side wall 25, and an inner face of the second side wall 26 form the housing space 27 surrounded by them. The container main body opening portion formed in the opening peripheral portion 31 communicates with the housing space 27 surrounded by the wall portion 20 and provided inside the container main body 2. The housing space 27 can house a maximum of twenty five substrates W.

As illustrated in FIG. 1, latch engagement concave portions 40A, 40B, 41A, and 41B recessed outward from the housing space 27 are formed in a part of the upper and lower walls 23 and 24 in the vicinity of the opening peripheral portion 31. A total of four latch engagement concave portions 40A, 40B, 41A, and 41B are provided respectively for the vicinities of both left and right ends of the upper and lower walls 23 and 24.

As illustrated in FIG. 1, a rib 28 is formed on an outer face of the upper wall 23 integrally with the upper wall 23. This rib 28 is provided to improve rigidity of the container main body.

A top flange 29 is fixed to the center of the upper wall 23. The top flange 29 is a member serving as a suspending hook for the housing container 1 when the housing container 1 is suspended in an automated material handling system (AMHS), a person guided vehicle (PGV), or the like.

Figure 2:
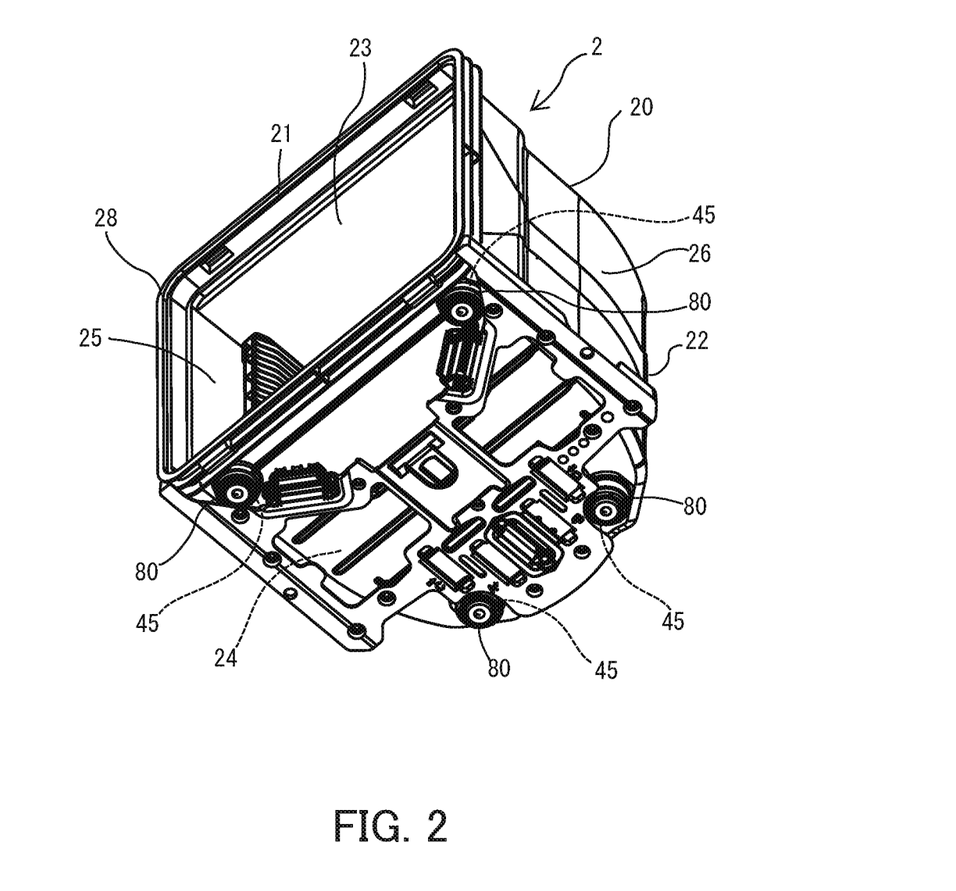
FIG. 2 is a lower perspective view illustrating a state in which the gas purge filter 80 according to the first embodiment of the present invention is installed in the housing container 1.

As illustrated in FIGS. 1 and 2, through-holes 45 as access openings for a ventilation passage are formed in four corners of the lower wall 24. According to the first embodiment, the two through-holes 45 in a front part of the lower wall 24 are outlet ports for discharging gas from the inside of the container, and the two through-holes 45 in a rear part are inlet ports for supplying gas to the inside of the container. A gas purge filter 80 is disposed in each of the through-holes 45 of the inlet and outlet ports.

As illustrated in FIGS. 3A, 3B, 4, and 5, the gas purge filter 80 has a first housing 100 as a filter housing 90, a second housing 200, a filter body 150, and a pad 300. The first housing 100 includes an upper first housing 101 and a lower first housing 102, and the filter body 150 is interposed between the upper first housing 101 and the lower first housing 102. The upper first housing 101 and the lower first housing 102 are fixed by ultrasonic welding.

As illustrated in FIGS. 1 and 2, according to this embodiment, the gas purge filter 80 is disposed in the lower wall 24 of the container main body 2 so that the upper first housing 101 faces the housing space 27 side. The gas purge filter 80 may also be installed in the wall portion or the lid body other than the lower wall 24.

A housing-space-side opening 120 is provided in the upper first housing 101 disposed on the housing space 27 side of the gas purge filter 80, and the gas purge filter 80 has a housing-space outer opening 121 disposed on the outer space side of the housing container 1. Such openings allow inner and outer spaces of the housing container 1 to communicate with each other through the ventilation space 110 inside the gas purge filter 80.

In this configuration, the gas purge filter 80 can pass gas through the filter body 150 in a direction from an external space of the container main body 2 to the housing space 27 (hereinafter, referred to as a "housing-space inward direction") or a direction from the housing space 27 to the external space of the container main body 2 (hereinafter, referred to as a "housing-space outward direction"). In this case, the filter body 150 obstructs the passing of any particles contained in the gas.

As illustrated in FIG. 5, the upper first housing 101 is provided with an upper ventilation space 111 communicating with the housing-space-side opening 120. A nozzle portion 103 having a substantially annular tubular shape is formed in the lower first housing 102 to protrude in a housing-space outward direction (downward in FIG. 5). A nozzle tip end portion 106 is formed in a tip end of the housing-space outward direction of the nozzle portion 103. In addition, a lower ventilation space 112 connected to the upper ventilation space 111 is provided in the lower first housing 102 and is connected to a nozzle-portion ventilation space 113 formed inside the nozzle portion 103. Therefore, the upper ventilation space 111, the lower ventilation space 112, and the nozzle-portion ventilation space 113 constitute the ventilation space 110 that allows the housing-space-side opening 120 and the housing-space outer opening 121 of the gas purge filter 80 to communicate with each other.

The lower first housing 102 has a thread portion 104 formed to cover the nozzle portion 103 in an annular shape outward in a radial direction. A space for holding the pad 300 described below is formed between the nozzle portion 103 and the thread portion 104. A pad abutting portion 105 where the pad abuts in the housing-space inward direction (upward in FIG. 5) is provided between the nozzle portion 103 and the thread portion 104.

The pad 300 formed of an elastic body is provided in a substantially cylindrical shape to cover an outer peripheral face of the nozzle portion 103 of the lower first housing 102. A pad outer-leading-end portion 306 is formed in the housing-space outward direction of this substantially cylindrical pad 300, and a pad inner-leading-end portion 305 abutting the pad abutting portion 105 is formed in the housing-space inward direction. A pad shoulder portion 304 is formed as a flange in the housing-space inward direction from the pad outer-leading-end portion 306 in order to fix the pad 300 to the second housing 200 and the first housing 100. In addition, the pad outer-leading-end portion 306 is provided with a pad inner protrusion 310 abutting an outer circumference of the nozzle tip end portion 106 of the nozzle portion 103 of the lower first housing 102. The pad inner protrusion 310 seals the pad 300 and the nozzle portion 103. For this reason, an inner diameter of the pad inner protrusion 310 of the pad 300 (inner diameter of the pad outer-leading-end portion 306) is formed to be smaller than an outer diameter of the nozzle tip end portion 106. Therefore, the pad 300 is configured so that the pad outer-leading-end portion 306 is inserted into the nozzle tip end portion 106 by being pressed by virtue of its elasticity.

The nozzle tip end portion 106 and the pad outer-leading-end portion 306 constitute a gas purge filter leading-end portion 406, which abuts the purge port 800 of the gas purge device to perform a gas purge operation. According to the first embodiment, before the gas purge filter leading-end portion 406 abuts the purge port 800, the nozzle tip end portion 106 and the pad outer-leading-end portion 306 are placed in the same position to allow the surfaces of the nozzle tip end portion 106 and the pad outer-leading-end portion 306 to be at the same height in the housing-space outward direction.

An inner bore surface of the second housing 200 is threaded so as to be engaged with the thread portion 104 of the lower first housing 102. As the second housing 200 is screwed to the thread portion 104, the pad shoulder portion 304 of the pad 300 is pressed by the second housing pressing portion 210 of the second housing 200, and the pad inner-leading-end portion 305 of the pad 300 is pressed to the pad abutting portion 105 of the lower first housing 102, so that the pad 300 is fixed to the first housing 100. In this case, the pressing direction of the pad shoulder portion 304 pressed by the second housing pressing portion 210 of the second housing 200 becomes the moving direction of the second housing 200 screwed to the first housing 100. A force applied to the pad 300 for screwing the second housing 200 (second housing fixing force) is received by the pad abutting portion 105 of the lower first housing 102. For this reason, even when the pad 300 is fixed to the first housing 100, airtightness between the pad outer-leading-end portion 306 and the nozzle tip end portion 106 is secured.

The second housing 200 is used to fix the pad 300 to the first housing 100 and to fix the gas purge filter 80 to the lower wall 24. When the gas purge filter 80 is fixed to the lower wall 24, an O-ring 114 is inserted between the gas purge filter 80 and the through-hole 45 of the lower wall 24 for sealing.

The first and second housings 100 and 200 are formed of a cycloolefin polymer that generates little outgas and has a low water/moisture absorption property. Instead of the cycloolefin polymer, any thermoplastic resin may be employed as long as it has a water/moisture absorption rate equal to or lower than a predetermined level and generates an amount of outgas equal to or smaller than a predetermined amount. For example, the resin may include polycarbonate, polyetherimide, polyether ether ketone, or the like. In addition, the pad 300 is formed of polyolefin elastomer as an elastic member. Instead of the polyolefin elastomer, resin such as polybutylene terephthalate or polyethylene, elastomer such as polyethylene elastomer, or a rubber material such as silicon rubber or fluororubber may also be used.

In the gas purge filter 80 described above, gas replacement (gas purge operation) using the gas purge device is performed as follows. When the housing container 1 is used as an in-process container in a factory, the lower wall 24 of the container main body 2 is placed in the lower side, and the upper wall 23 is placed in the upper side. A gas purge operation method using the gas purge filter 80 of the housing container 1 may be performed by blocking the container main body opening portion 21 of the container main body 2 with the lid body 3 or by removing the lid body 3 from the housing container 1. In the following description, it is assumed that the gas purge operation is performed by blocking the container main body 2 with the lid body 3.

While the container main body opening portion of the container main body 2 is closed by the lid body 3, a purge port leading-end portion 802 of the purge port 800 of the gas purge device abuts the gas purge filter leading-end portion 406 of the gas purge filter 80 provided in the through-hole 45 of the lower wall 24 of the container main body 2. Since a pad 300 as an elastic body is provided around the opening of the nozzle portion 103 of the first housing 100, it is possible to obtain reliable airtightness (sealing) between the purge port leading-end portion 802 and the gas purge filter leading-end portion 406 when the purge port 800 abuts. Then, a purge gas is supplied from the gas purge device, and the purge gas supplied from the purge gas flow passage 801 is supplied to the housing space 27 of the housing container 1 through the ventilation space 110 including the nozzle-portion ventilation space 113, the lower ventilation space 112, and the upper ventilation space 111. In this case, as the purge gas passes through the filter body 150, no contamination particles enter the housing space 27. The gas inside the housing container 1 is discharged to the outside of the housing container 1 from the gas purge filter 80, so that the gas purge operation is performed.

In the gas purge operation described above, a diameter of the purge gas flow passage 801 is smaller than the housing-space outer opening 121 of the gas purge filter 80, and an outer size of the purge port is larger than an outer size of the nozzle tip end portion 106. Therefore, the gas purge operation is performed so that the purge gas discharged from the purge gas flow passage 801 is all supplied to the nozzle-portion ventilation space 113, and no purge gas comes into contact with the elastic pad 300 at all.

Using the gas purge filter 80 according to the first embodiment describe above, it is possible to obtain the following effects. The elastic pad 300 is useful to reliably obtain airtightness in the contact between the purge port 800 and the gas purge filter 80. However, the pad 300 is an elastic body. If the purge gas comes into contact with the elastic pad 300, moisture contained in the pad 300 or a substance hazardous to the housed substrate is mixed in the purge gas, and this purge gas is discharged into the housing space 27 of the housing container 1. This may hinder reduction of moisture (humidity) of the housing space of the housing container 1, which is an object of the gas purge operation. Meanwhile, according to the present invention, no elastic body is inserted into the ventilation space where the purge gas passes. Therefore, moisture discharged from the pad 300 during the gas purge operation or a substance hazardous to the substrate is not discharged to the housing space 27 inside the housing container 1. Therefore, it is possible to provide a clean environment at a low humidity in the housing space 27 of the housing container 1.

In addition, since the inner diameter of the pad outer-leading-end portion 306 is smaller than the outer diameter of the nozzle tip end portion 106 in a single body state of the pad 300 (that is, before the pad 300 is incorporated into the gas purge filter 80), adhesion between the pad 300 and the nozzle portion 103 is improved. Therefore, while the pad 300 is installed in the first housing 100 using the second housing 200, airtightness between the lower first housing 102 and the pad 300 is secured. As a result, it is possible to prevent a cleaning solution used to clean the gas purge filter 80 from intruding into the gap 301 between the lower first housing 102 and the pad 300 and to reduce the time necessary for the subsequent dry work.

Second Embodiment

Figure 7A:
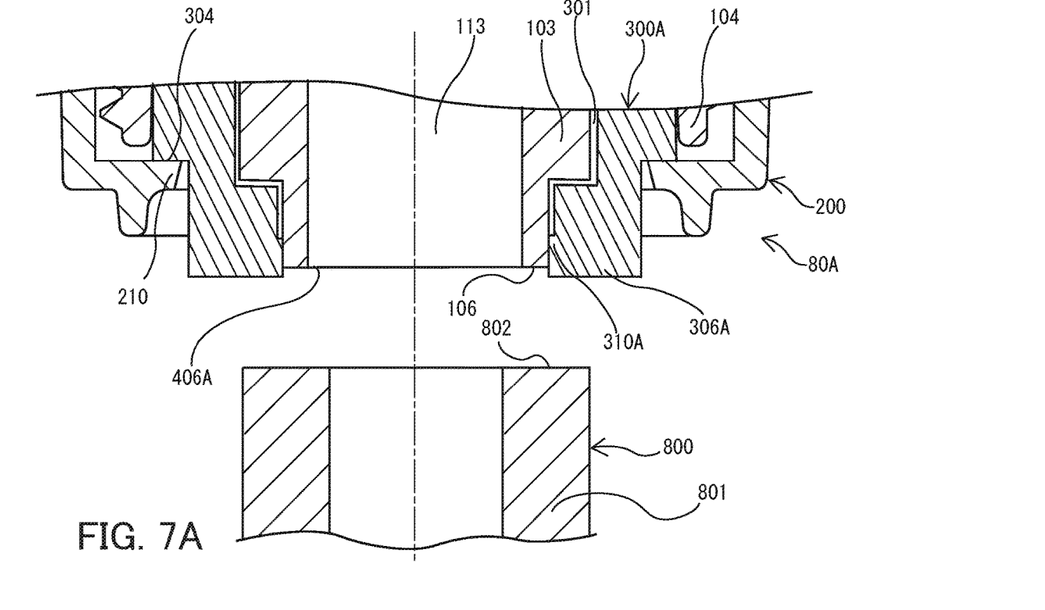
FIG. 7A is an enlarged cross-sectional view illustrating the vicinity of a gas purge filter leading-end portion 406A of the gas purge filter 80A according to a second embodiment of the present invention before the gas purge filter 80A abuts the purge port 800.
Figure 7B:
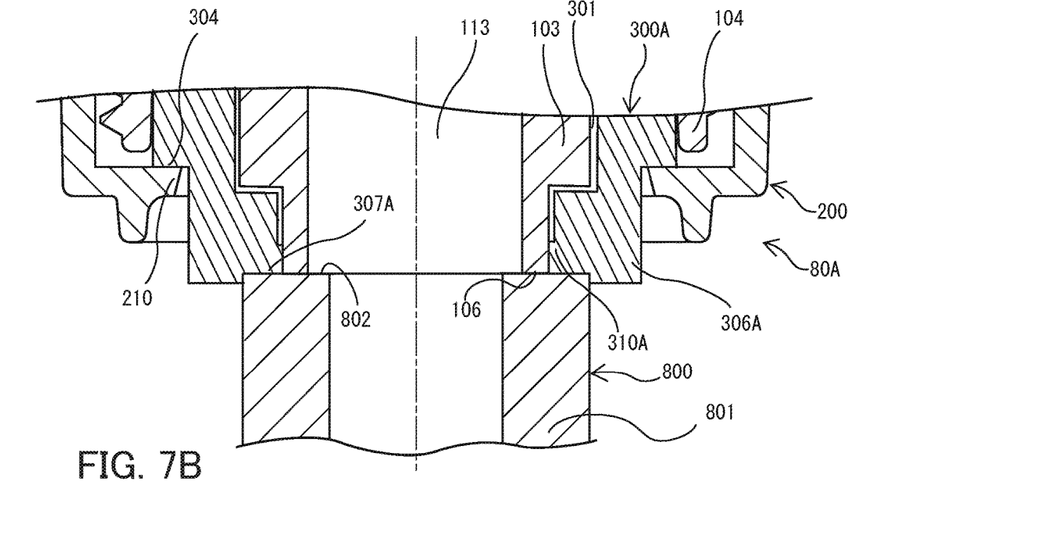
FIG. 7B is an enlarged cross-sectional view illustrating the vicinity of the gas purge filter leading-end portion 406A of the gas purge filter 80A according to the second embodiment of the present invention when the gas purge filter 80A abuts the purge port 800.

Next, a gas purge filter 80A according to a second embodiment of the present invention will be described with reference to FIGS. 7A and 7B. FIG. 7A is an enlarged cross-sectional view illustrating the vicinity of a gas purge filter leading-end portion 406A of the gas purge filter 80A according to the second embodiment of the present invention before the gas purge filter 80A abuts the purge port 800. FIG. 7B is an enlarged cross-sectional view illustrating the vicinity of the gas purge filter leading-end portion 406A of the gas purge filter 80A according to the second embodiment of the present invention when the gas purge filter 80A abuts the purge port 800.

The gas purge filter according to the second embodiment is different from the gas purge filter of the first embodiment in terms of the shape of the gas purge filter leading-end portion. The other parts are similar to those of the gas purge filter 80 of the first embodiment. Therefore, like reference numerals denote like elements as in the first embodiment, and they will not be described again.

As illustrated in FIG. 7A, before the gas purge filter 80A abuts the purge port 800, the pad outer-leading-end portion 306A protrudes in the housing-space outward direction from the nozzle tip end portion 106 of the nozzle portion 103 of the first housing 100.

If the gas purge filter 80A abuts the purge port 800 to perform a gas purge operation, the elastic pad 300A is pressed to the purge port 800, and the pad outer-leading-end portion 306A is partially deformed as illustrated in FIG. 7B (pad outer-leading-end deformation portion 307A). By virtue of this deformation, the purge port leading-end portion 802 of the purge port 800 abuts the nozzle portion 103.

The nozzle tip end portion 106 of the nozzle portion 103 abuts the purge port leading-end portion 802 of the purge port 800, and an outer periphery of the purge port 800 is sealed by the pad outer-leading-end deformation portion 307A. Therefore, according to this embodiment, even when the pad outer-leading-end portion 306A protrudes in the housing-space outward direction from the nozzle tip end portion 106 before the purge port 800 abuts the gas purge filter 80A, the purge gas does not come into contact with the elastic pad 300A in the gas purge operation as in the first embodiment. In addition, moisture discharged from the pad 300A during the gas purge operation or a substance hazardous to the substrate is not discharged to the housing space 27 of the housing container 1. Therefore, it is possible to provide a clean environment in the housing space 27 of the housing container 1 at a low humidity.

The pad outer-leading-end portion 306A is deformed when the purge port 800 abuts the nozzle portion 103. Therefore, it is possible to improve adhesion between the purge port 800 and the pad outer-leading-end portion 306A and more effectively discharge the purge gas from the purge port 800 into the housing space 27.

Third Embodiment

Figure 8A:
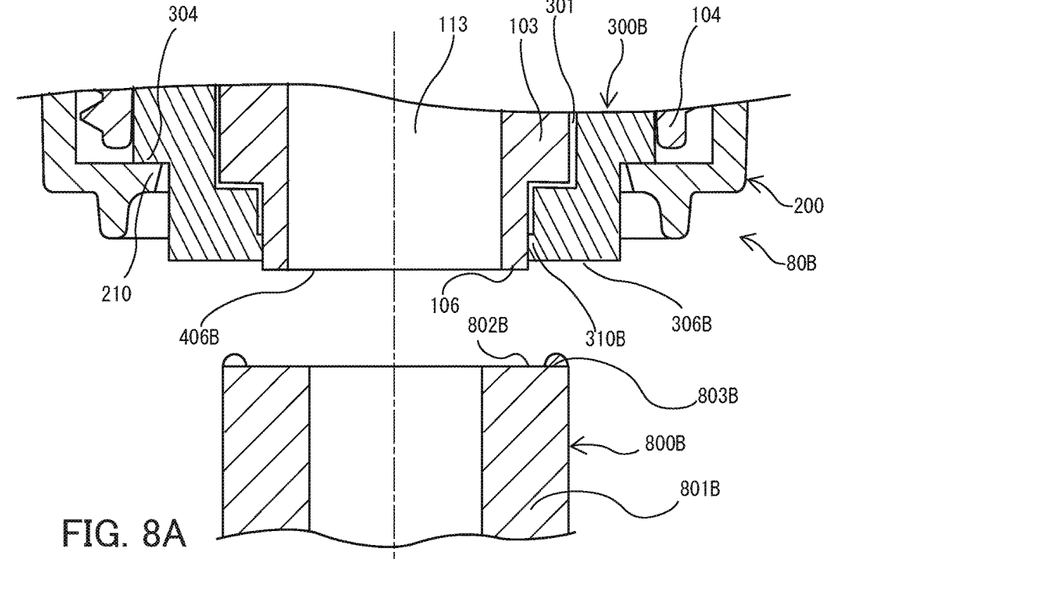
FIG. 8A is an enlarged cross-sectional view illustrating the vicinity of a gas purge filter leading-end portion 406B of the gas purge filter 80B according to a third embodiment of the present invention before the gas purge filter 80B abuts the purge port 800B.
Figure 8B:
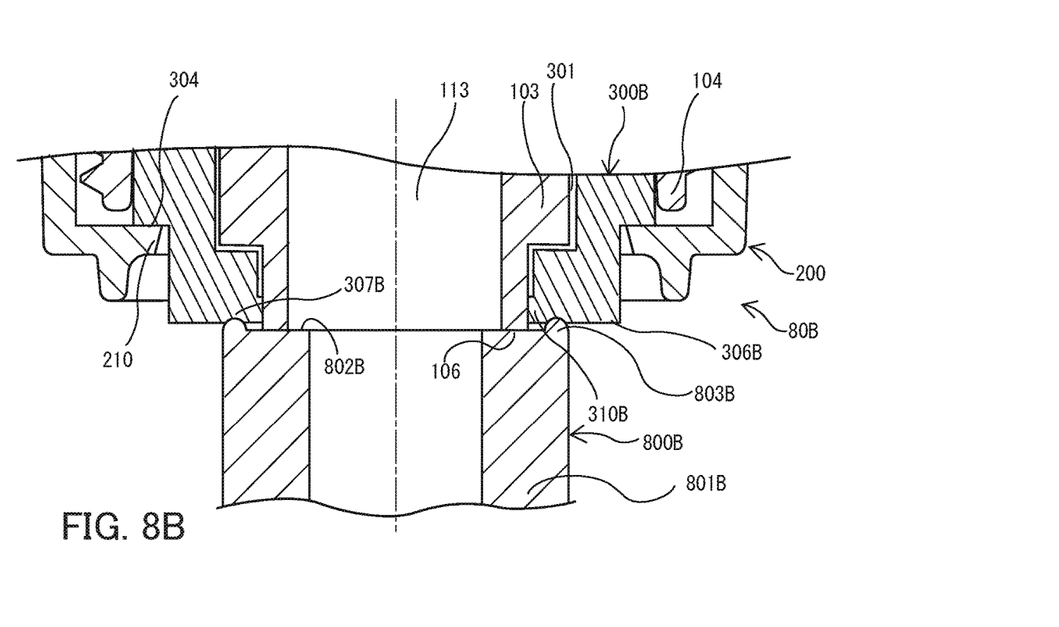
FIG. 8B is an enlarged cross-sectional view illustrating the vicinity of the gas purge filter leading-end portion 406B of the gas purge filter 80B according to the third embodiment of the present invention when the gas purge filter 80B abuts the purge port 800B.

Next, a gas purge filter 80B according to a third embodiment of the present invention will be described with reference to FIGS. 8A and 8B. FIG. 8A is an enlarged cross-sectional view illustrating the vicinity of a gas purge filter leading-end portion 406B of the gas purge filter 80B according to the third embodiment of the present invention before the gas purge filter 80B abuts the purge port 800. FIG. 8B is an enlarged cross-sectional view illustrating the vicinity of the gas purge filter leading-end portion 406B of the gas purge filter 80B according to the third embodiment of the present invention when the gas purge filter 80B abuts the purge port 800.

The gas purge filter according to the third embodiment is different from that of the first embodiment in terms of the shape of the gas purge filter leading-end portion and the shape of the purge port leading-end portion. The other parts are similar to those of the gas purge filter 80 of the first embodiment. Therefore, like reference numerals denote like elements as in the first embodiment, and they will not be described again.

As illustrated in FIG. 8A, the nozzle tip end portion 106 of the nozzle portion 103 of the first housing 100 protrudes in the housing-space outward direction from the pad outer-leading-end portion 306B of the pad 300B. In addition, the purge port leading-end portion 802B does not have a flat surface, but has a purge port ring-like protrusion 803B having an inner diameter larger than the outer diameter of the nozzle portion 103.

If the gas purge filter 80B abuts the purge port 800B to perform a gas purge operation, a part of the purge port leading-end portion 802B inward of the purge port ring-like protrusion 803B of the purge port 800B abuts the nozzle tip end portion 106 of the nozzle portion 103 as illustrated in FIG. 8B. In this case, the purge port ring-like protrusion 803B is deformed and nipped into a part of the pad outer-leading-end portion 306B of the elastic pad 300B recessed inward of the housing space from the nozzle tip end portion (pad outer-leading-end deformation portion 307B).

The nozzle tip end portion 106 of the nozzle portion 103 abuts the purge port leading-end portion 802B of the purge port 800B, and an outer periphery of the purge port 800B is sealed by the pad outer-leading-end deformation portion 307B. Therefore, according to this embodiment, even when the pad outer-leading-end portion 306B protrudes in the housing-space outward direction from the nozzle tip end portion 106 before the purge port 800B abuts the gas purge filter 80B, the purge gas does not come into contact with the elastic pad 300B in the gas purge operation as in the first embodiment. In addition, moisture discharged from the pad 300B during the gas purge operation or a substance hazardous to the substrate is not discharged to the housing space 27 of the housing container 1. Therefore, it is possible to provide a clean environment in the housing space 27 of the housing container 1 at a low humidity.

Fourth Embodiment

Figure 9:
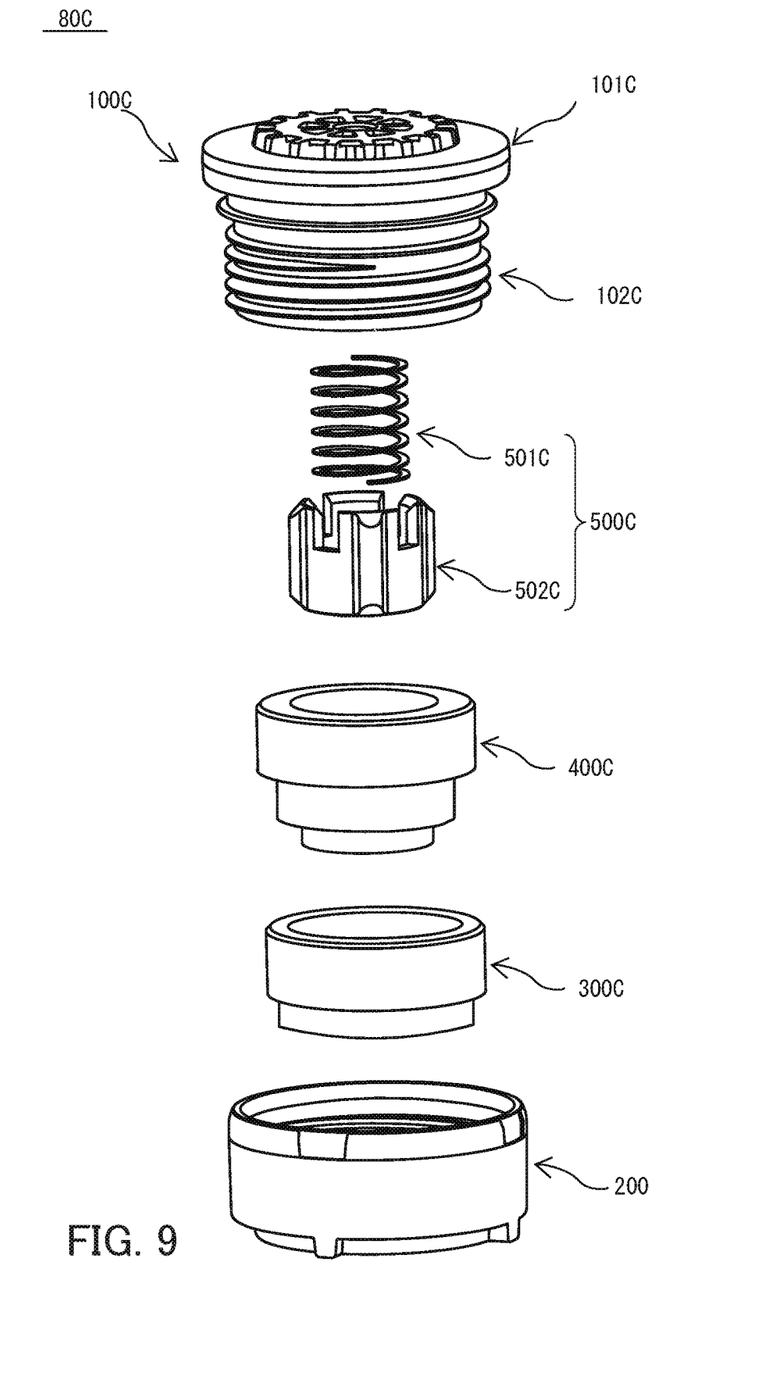
FIG. 9 is an exploded perspective view illustrating the gas purge filter 80C according to a fourth embodiment of the present invention.
Figure 10:
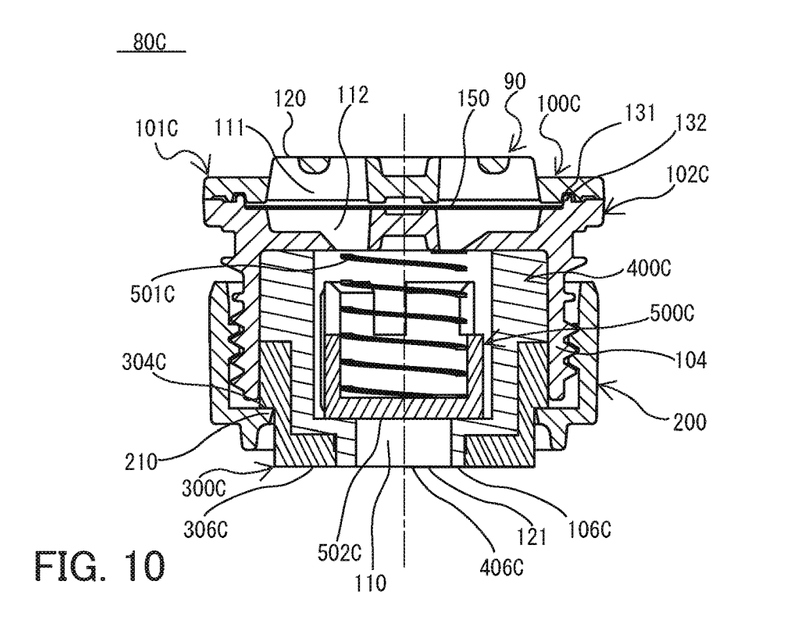
FIG. 10 is a cross-sectional view illustrating an inlet-side gas purge filter of the gas purge filter 80C according to the fourth embodiment of the present invention.
Figure 11:
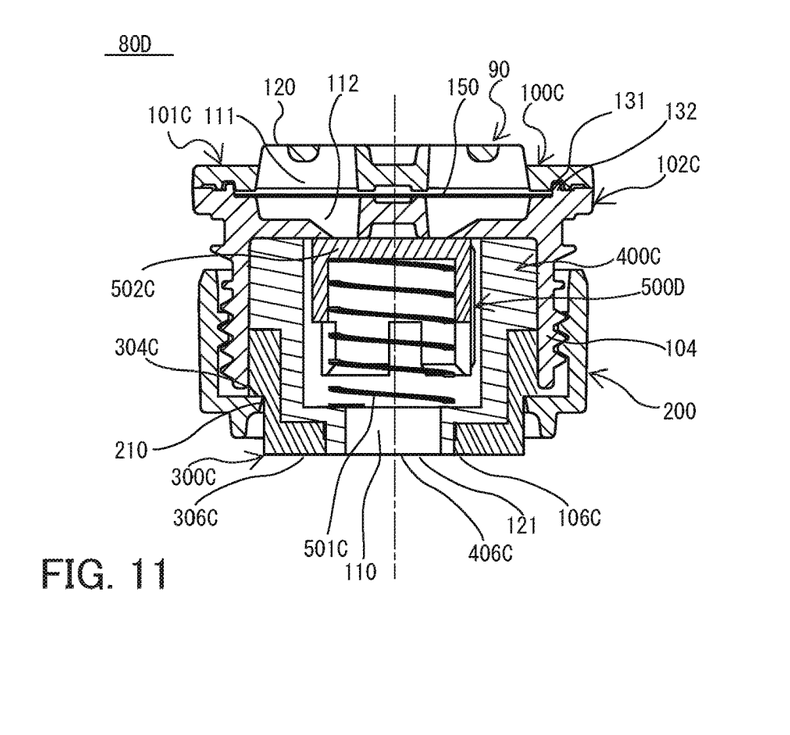
FIG. 11 is a cross-sectional view illustrating an outlet-side gas purge filter of the gas purge filter 80C according to the fourth embodiment of the present invention.

Next, gas purge filters 80C and 80D according to a fourth embodiment of the present invention will be described with reference to FIGS. 9 to 11. FIG. 9 is an exploded perspective view illustrating the gas purge filter 80C according to the fourth embodiment of the present invention. FIG. 10 is a cross-sectional view illustrating an inlet-side gas purge filter of the gas purge filter 80C according to the fourth embodiment of the present invention. FIG. 11 is a cross-sectional view illustrating an outlet-side gas purge filter of the gas purge filter 80D according to the fourth embodiment of the present invention.

The gas purge filters 80C and 80D according to the fourth embodiment are different from the gas purge filter of the first embodiment in that an actuating member 500C is added as a check valve mechanism for controlling a flow direction of the purge gas to a certain direction. The other parts are similar to those of the gas purge filter 80 of the first embodiment. Therefore, like reference numerals denote like elements as in the first embodiment, and they will not be described again.

The gas purge filter 80C of FIGS. 9 and 10 is a gas purge filter for supplying a purge gas to the housing space 27 from an external space of the housing container 1.

An actuating member 500C as a check valve mechanism for controlling a flow direction of the purge gas to a certain direction is arranged in the middle of the ventilation space 110 of the first filter housing 100C of the first embodiment. In order to incorporate this actuating member 500C into the first filter housing 100C, an inner housing 400C for maintaining the actuating member 500C in the inner side is provided in the lower first housing 102C from which the nozzle portion of the lower first housing of the first embodiment is removed.

A nozzle tip end portion 106C is formed in the housing-space outward direction of the inner housing 400C, and a pad 300C is provided to cover its outer circumferential portion. Similar to the first embodiment, the pad 300C is provided with a pad shoulder portion 304C. In order to fix the pad 300C to the first housing, the pad shoulder portion 304C of the pad 300C is pressed by the second housing pressing portion 210 of the second housing 200 and is inserted in the housing-space inward direction of the lower first housing along with the inner housing 400C.

The actuating member 500C as a check valve mechanism has a valve body 502C and a spring 501C for biasing the valve body 502C in a certain direction. In the embodiment of FIG. 10, the valve body 502C is disposed in the ventilation space 110 inside the inner housing 400C in the housing-space outward direction, and the spring 501C for biasing the valve body 502C into the inner surface of the inner housing 400C is disposed between the valve body 502C and the lower first housing 102C.

A positional relationship between the pad outer-leading-end portion 306C of the pad 300C and the nozzle tip end portion 106C of the inner housing 400C is similar to that of the first embodiment, and it will not be described again.

Using the gas purge filter 80C, the purge gas is supplied to the housing space 27 in the manner similar to that of the first embodiment. In this case, the valve body 502C moves in the housing-space inward direction, and the purge gas is supplied to the housing space 27 from the outside of the housing container 1 through the ventilation space 110. As the supply of the purge gas stops, the valve body 502C closes the ventilation space 110 by virtue of the spring 501C. Therefore, discharge of the gas from the housing space 27 to the outside of the housing container 1 is prevented.

The gas purge filter 80D of FIG. 11 is a gas purge filter for discharging the purge gas from the housing space 27 to the outside of the housing container 1. The gas purge filter 80D is different from the gas purge filter 80C of FIGS. 9 and 10 only in that the spring 501C and the valve body 502C of the actuating member as a check valve mechanism are vertically reversed.

If the purge gas supplied from the gas purge filter 80C to the housing space 27 has a pressure equal to or higher than a certain level inside the housing space 27, the valve body 502C of the actuating member 500D of the gas purge filter 80D moves in the housing-space outward direction, and gas is discharged from the housing space 27 to the outside of the housing container 1. Then, if the pressure becomes equal to or lower than a certain level, the valve body 502C returns to its original position, and the discharge of gas from the housing space 27 to the outside of the housing container 1 stops.

Using the gas purge filter according to the fourth embodiment having the aforementioned configuration, it is possible to incorporate the check valve mechanism into the inside of the filter in addition to the effects of the first embodiment. Furthermore, it is possible to control the supply of the purge gas to the housing space 27 of the housing container 1 and discharge from the housing space 27. Therefore, it is possible to more effectively perform the gas purge operation.

EXPLANATION OF REFERENCE NUMERALS 1 housing container
2 container main body
3 lid body
24 lower wall
25 through-hole (access opening)
80, 80A, 80B, 80C, 80D gas purge filter
90 filter housing
100, 100C first housing
101, 101C upper first housing
102, 102C lower first housing
103 nozzle portion
105 pad abutting portion
106, 106C nozzle tip end portion
110 ventilation space
111 upper ventilation space
112 lower ventilation space
113 nozzle-portion ventilation space
120 housing-space-side opening
121 housing-space outer opening
150 filter body
200 second housing
210 second housing pressing portion
300, 300A, 300B, 300C pad
305 pad inner-leading-end portion
306, 306A 306B, 306C pad outer-leading-end portion
307A, 307B pad outer-leading-end deformation portion
310, 310A, 310B pad inner protrusion
400C inner housing
406, 406A, 406B, 406C gas purge filter leading-end portion
500C, 500D actuating member (check valve mechanism)
501C spring
502C valve body
800, 800B purge port
801, 801B purge gas flow passage
802, 802B purge port leading-end portion
803B purge port ring-like protrusion
W substrate

The invention claimed is:

1. A gas purge filter in a housing container internally provided with a housing space formed by a container main body having a container main body opening portion in one end portion and a lid body that can be removably attached to the container main body opening portion and can close the container main body opening portion, the gas purge filter being installed in an access opening that can allow an external space of the housing container formed in at least one of the container main body or the lid body and the housing space to communicate with each other, the gas purge filter comprising:
a filter housing having a ventilation space where gas outside the housing container and gas of the housing space can be ventilated;
a pad formed outside a housing space of the filter housing to cover an outer peripheral face of a nozzle portion that forms a part of the ventilation space; and
a gas purge filter leading-end portion having a nozzle tip end portion formed in a tip end portion of the nozzle portion in a housing-space outward direction; and a pad outer-leading-end portion formed in a leading end portion of the pad in the housing-space outward direction,
wherein the filter housing is formed of thermoplastic resin,
the pad is formed of an elastic body,
when a purge port of a gas purge device for purging an internal gas of the housing container abuts the gas purge filter leading-end portion to perform a gas purge operation, the nozzle tip end portion is placed in the same position as that of the pad outer-leading-end portion abutting the gas purge filter leading-end portion or protrudes in the housing-space outward direction,
before the purge port abuts the gas purge filter leading-end portion, the pad outer-leading-end portion is placed in the same position as that of the nozzle tip end portion or protrudes in the housing-space outward direction.

2. The gas purge filter according to claim 1, wherein, before the purge port abuts the gas purge filter leading-end portion,
the nozzle tip end portion protrudes in the housing-space outward direction from the position of the pad outer-leading-end portion.

3. The gas purge filter according to claim 1, wherein an inner diameter of the pad outer-leading-end portion in a single body state of the pad is smaller than an outer diameter of the nozzle tip end portion.

4. The gas purge filter according to claim 1, wherein a check valve mechanism for restricting a flow direction of the gas in a certain direction is provided in the ventilation space of the filter housing.

* * * * *